United States Patent
Hau-Riege et al.

(10) Patent No.: US 6,667,225 B2
(45) Date of Patent: Dec. 23, 2003

(54) WAFER-BONDING USING SOLDER AND METHOD OF MAKING THE SAME

(75) Inventors: Stefan Hau-Riege, Milpitas, CA (US); Christine Hau-Riege, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 10/015,618

(22) Filed: Dec. 17, 2001

(65) Prior Publication Data

US 2003/0113976 A1 Jun. 19, 2003

(51) Int. Cl.[7] .............................................. H01L 21/301
(52) U.S. Cl. ...................... 438/462; 438/455; 438/109; 438/15; 438/458
(58) Field of Search ................................ 438/455, 462, 438/109, 15, 458

(56) References Cited

U.S. PATENT DOCUMENTS

| | | | | |
|---|---|---|---|---|
| 5,935,430 A | * | 8/1999 | Craig .................. | 210/198.2 |
| 6,406,636 B1 | * | 6/2002 | Vaganov .................. | 216/2 |
| 6,537,087 B2 | * | 3/2003 | McNamara et al. ........ | 439/108 |
| 2002/0126459 A1 | * | 9/2002 | Albert et al. .............. | 361/743 |

* cited by examiner

Primary Examiner—Long Pham
(74) Attorney, Agent, or Firm—Blakely, Sokoloff, Taylor & Zafman LLP

(57) ABSTRACT

A method is provided for forming a wafer stack. This may include providing a first wafer having a first plurality of metalized trenches on a surface of the first wafer. A second wafer may be provided having a second plurality of metalized trenches on a surface of the second wafer facing the first wafer. The first plurality of metalized trenches may be solder bonded to the second plurality of metalized trenches.

18 Claims, 10 Drawing Sheets

WAFER-BONDING USING SOLDER AND METHOD OF MAKING THE SAME

FIELD

The present invention is related to the fabrication of wafer stacks. More particularly, the present invention is related to the fabrication of wafer stacks using solder to adjoin adjacent metalized trenches.

BACKGROUND

Since the development of integrated circuit technology, computers and computer storage devices have been made from wafers of semiconductor material comprising a plurality of integrated circuits. After a wafer is made, the circuits are typically separated from each other by dicing the wafer into individual chips. Thereafter, the individual chips may be bonded to carriers of various types, interconnected by wires and packaged. However, such two-dimensional packages of chips may fail to optimize the number of circuits that may be fabricated in a given space, and may also introduce undesirable signal delays, capacitance, and inductance as signals travel between chips.

Recently, three-dimensional stacks of single chips have emerged as an important packaging approach. A typical multi-chip electronic module may include multiple individual integrated circuit chips adhesively secured together as a monolithic structure (i.e., a "wafer stack") extending in one direction as a single row or column. Each of the individual wafers may be electrically coupled to an adjacent wafer through electrical connections. One problem with the formation of wafer stacks is how to make proper and complete electrical connections between the respective layers of the wafer stack.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
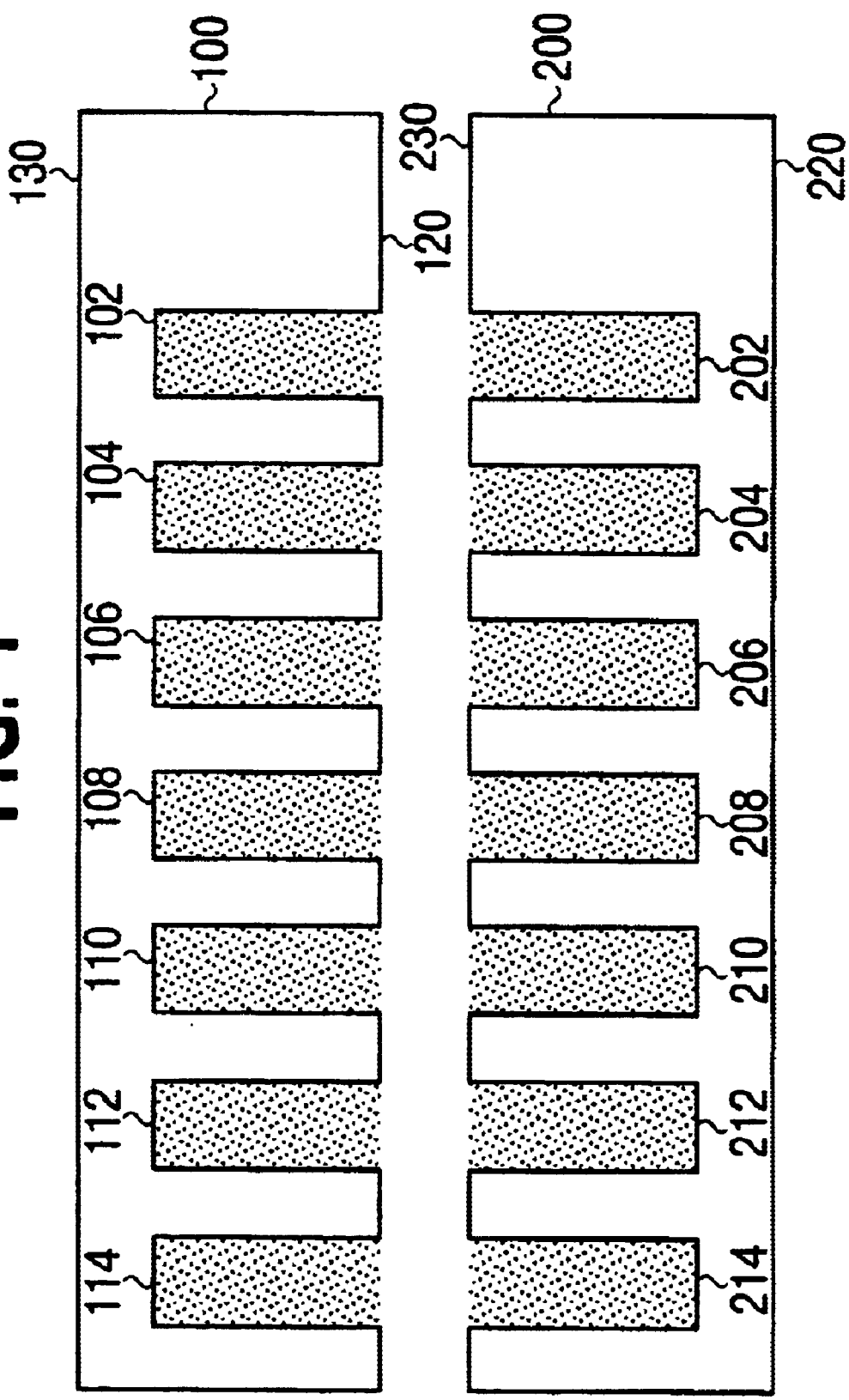
FIG. 1 illustrates two separated wafers having metalized trenches.

In the following detailed description, like reference numerals and characters may be used to designate identical, corresponding or similar components in differing figure drawings. Further, in the detailed description to follow, example embodiments may be described, although the present invention is not limited to the same. Where specific details are set forth in order to describe example embodiments of the present invention, it should be apparent to one skilled in the art that the invention could be practiced without, or with variation of, these specific details.

Embodiments of the present invention may be described with respect to wafers having a top surface and a bottom surface. One skilled in the art would understand that any reference to a top surface and a bottom surface is merely exemplary of the figure drawings based on orientation of the page. That is, a top surface on the figure drawings may not correspond to a top surface in actual use. It is intended that the terminology top and bottom are merely for reference with respect to the figure drawings. Further, embodiments of the present invention may be described with respect to two wafers. The present invention is also intended to cover wafer stacks having more than two wafers.

Embodiments of the present invention may provide a method of forming a wafer stack. This may include providing a first wafer having a plurality of metalized trenches on a surface of the first wafer and providing a second wafer having a plurality of metalized trenches on a surface of the second wafer facing the first wafer. Solder may be applied to the plurality of metalized trenches on the first wafer and may be applied to the plurality of metalized trenches on the second wafer. The plurality of metalized trenches on the first wafer may be solder-bonded to the plurality of metalized trenches on the second wafer by appropriately heating the solder to cause re-flow.

Embodiments of the present invention may provide a wafer stack including a first wafer having a first plurality of metalized trenches on a surface of the first wafer, a second wafer having a second plurality of metalized trenches on a surface of the second wafer, and a plurality of solder masses each provided between one of the first plurality of metalized trenches on the first wafer and a corresponding one of said second plurality of metalized trenches on the second wafer to electrically connect each of the plurality of metalized trenches on the first wafer with the corresponding one of the second plurality of metalized trenches on the second wafer.

As indicated above, semiconductor technologies may implement three-dimensional interconnect structures (i.e., wafer stacks) rather than two-dimensional planar interconnect schemes. The three-dimensional structures may help reduce delays induced by excessive interconnect lengths. The stacking of wafers enables the integration of different processing technologies such as silicon based logic and memory, III–V technology and optical interconnects. Inter-wafer electrical connections may be achieved by bringing the outer metal layers of each wafer in direct contact with one another. Arrangements and embodiments will now be described with respect to these inter-wafer electrical connections.

FIG. 1 illustrated two wafers with each having a plurality of metalized trenches. In FIG. 1, each of the wafers are physically separated from one other. More specifically, FIG. 1 illustrates a first wafer 100 having a bottom surface 120 and a top surface 130. One skilled in the art would understand that FIG. 1 (and the figures to be described) merely shows a small section of the wafer 100. The wafer 100 includes a plurality of trenches 102, 104, 106, 108, 110, 112 and 114 formed along the bottom surface 120 of the wafer 100. Each of the trenches 102–114 may be filled with a metal (such as copper or a copper alloy, for example) to form a metalized trench.

FIG. 1 also illustrates a wafer 200 having a bottom surface 220 and a top surface 230. The wafer 200 includes a plurality of trenches 202, 204, 206, 208, 210, 212 and 214 formed along the top surface 230 of the wafer 200. Each of the trenches 202–214 may be filled with a metal to form a metalized trench.

FIG. 1 shows a situation in which the bottom surface 120 of the wafer 100 is flat or planar and the top surface 230 of the wafer 200 is flat or planar. In this situation, the first wafer 100 may be secured to the second wafer 200 by pressing the wafers 100, 200 together. This is called pressure bonding. Other methods to secure the wafers 100, 200 together are also possible.

Figure 2:
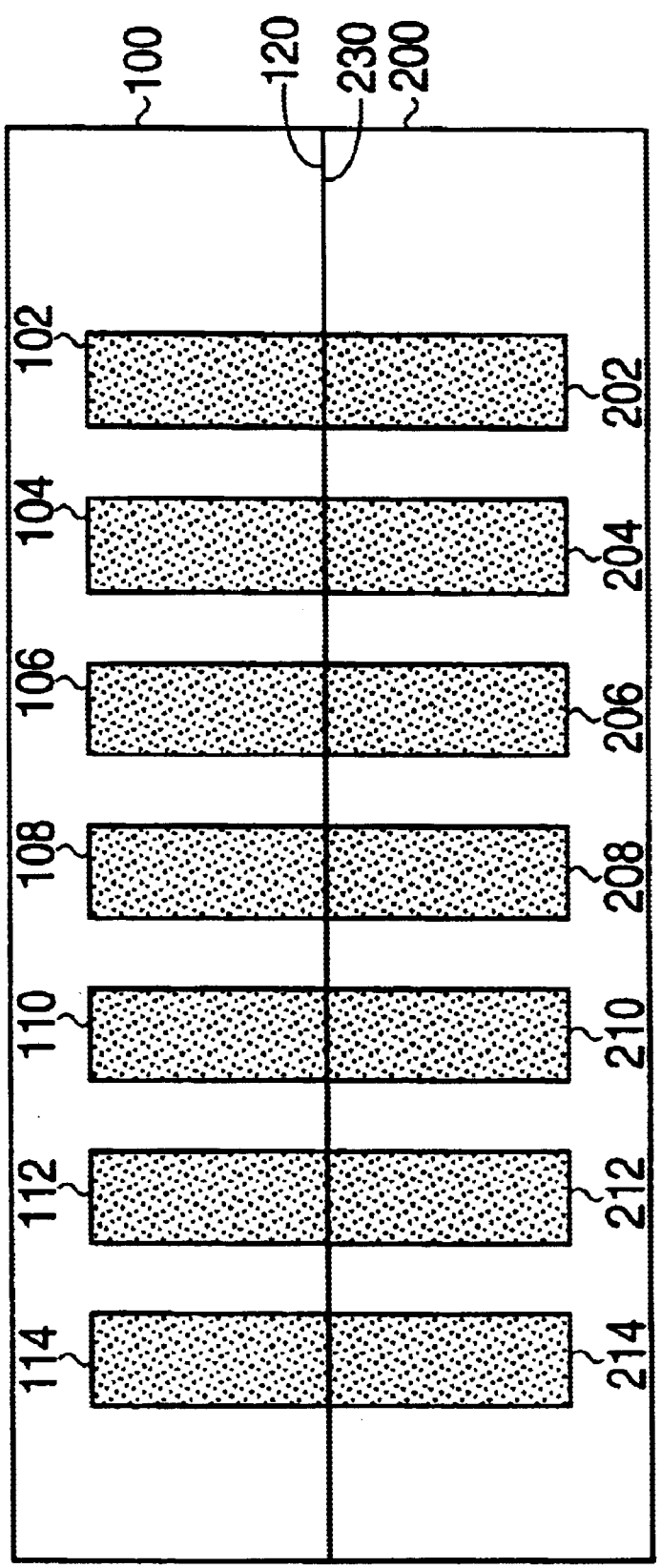
FIG. 2 illustrates the wafers of FIG. 1 joined together.

FIG. 2 shows the two wafers of FIG. 1 after they have been pressure bonded together. When copper (or a copper alloy) is used as the metal in each of the respective trenches, then pressure bonding may be achieved at approximately 400° C. FIG. 2 shows that the bottom surface 120 of the wafer 100 is fit up against the top surface 230 of the wafer 200. This may be achieved due to the planar surfaces 120 and 230. FIG. 2 also shows that each of the plurality of trenches 102–114 of the first wafer 100 is electrically coupled (or connected) to a corresponding one of the plurality of trenches 202–214 of the wafer 200. However, in actual use wafers are not perfectly flat or planar as they may be curved due to polishing or due to curvature of the wafer. The curvature may thereby cause problems in the electrical connections of the trenches 102–114 to the trenches 202–214.

Figure 3:
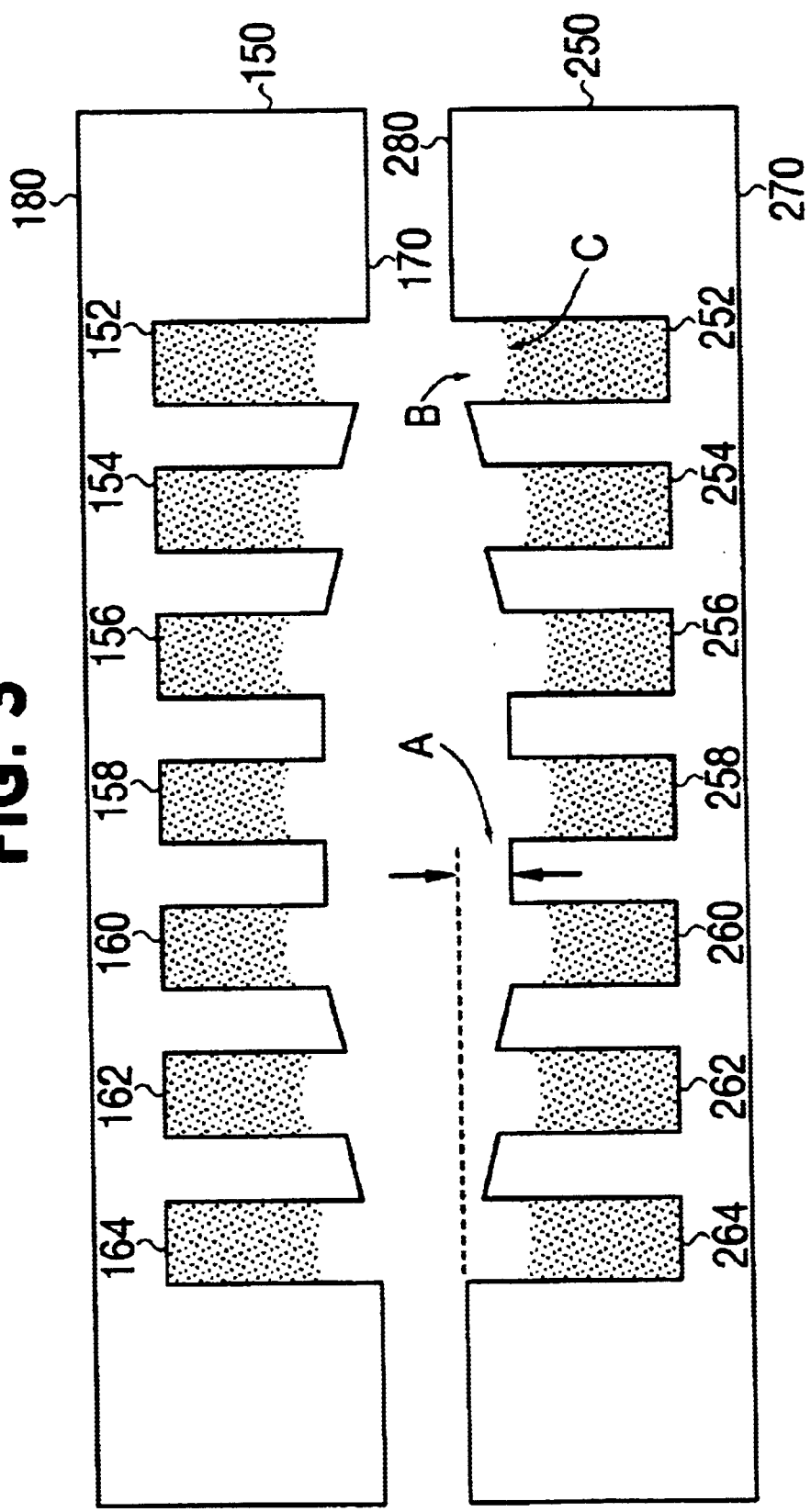
FIG. 3 illustrates two separated wafers having metalized trenches.

FIG. 3 illustrates a first wafer 150 having a bottom surface 170 and a top surface 180. The wafer 150 also includes a plurality of trenches 152, 154, 156, 158, 160, 162 and 164 formed along a bottom surface 170 of the wafer 150. FIG. 3 also illustrates a second wafer 250 having a bottom surface 270 and a top surface 280. The wafer 250 also includes a plurality of trenches 252, 254, 256, 258, 260, 262 and 264 formed along a top surface 280 of the wafer 250. FIG. 3 additionally shows problems that may occur to both the wafer and the metalized areas within the respective trenches. The wafer surfaces may exhibit topographical features such as curvature (e.g., due to thermal strains) and local thickness variations (e.g., due to CMP erosion), and often the metal may be recessed (e.g., due to CMP dishing and recess). This makes it difficult to bond the wafers together and achieve electrical connections. For example, FIG. 3 shows that the bottom surface 170 of the wafer 150 is not perfectly flat. FIG. 3 also shows that the top surface 280 of the wafer 250 is not perfectly flat. Arrow A illustrates this difference (hereafter also called erosion) in the height of the top layer 280 of the wafer 250. Arrow B illustrates recessing in which the metal of the trench 252 (and the other trenches shown in FIG. 3) does not completely fill to the top of the trench. Arrow C illustrates dishing in which the metal within the trench 252 (and the other trenches shown in FIG. 3) forms a curved surface. The erosion, recessing and dishing makes bonding of the wafer 150 to the wafer 250 difficult in terms of making the proper electrical connections between the metalized areas.

Figure 4:
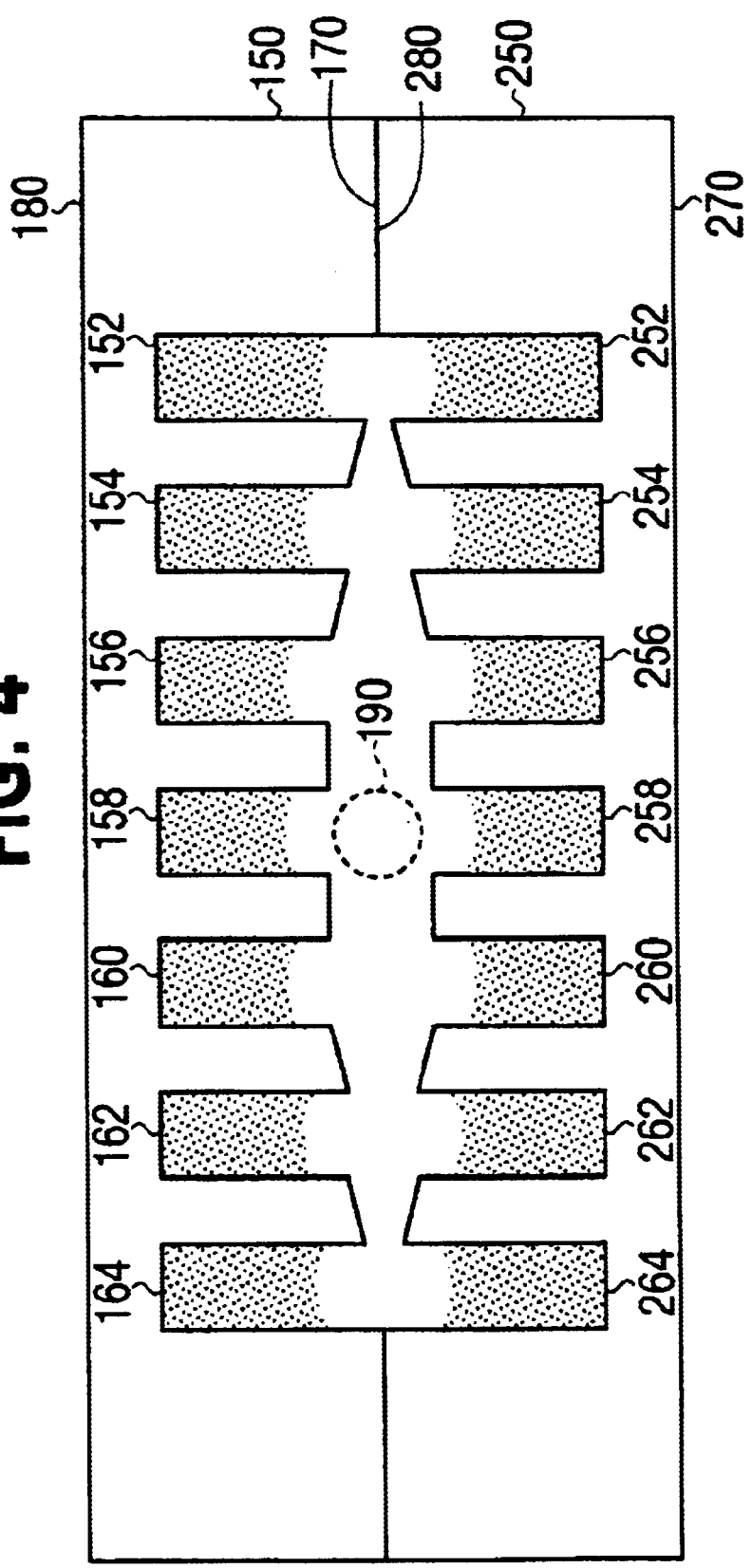
FIG. 4 illustrates the wafers of FIG. 3 joined together.

FIG. 4 illustrates the wafers 150 and 250 after they have been pressure bonded together. While portions of the bottom surface 170 of the wafer 150 may contact the top surface 280 of the wafer 250, each of the metalized surfaces of the wafer 150 may not electrically contact the corresponding metalized surface on the wafer 250. In FIG. 4, a dotted area 190 illustrates one area in which the metal within the trench 158 (on the wafer 150) does not electrically contact the metal within the trench 258 (on the wafer 250). FIG. 4 also shows that each of the other trenches 152, 154, 156, 158, 160, 162 and 164 does not electrically contact a corresponding one of the trenches 252, 254, 256, 260, 262 and 264. This lack of electrical connection (or electrical open) may make the wafer stack unusable.

Figure 5:
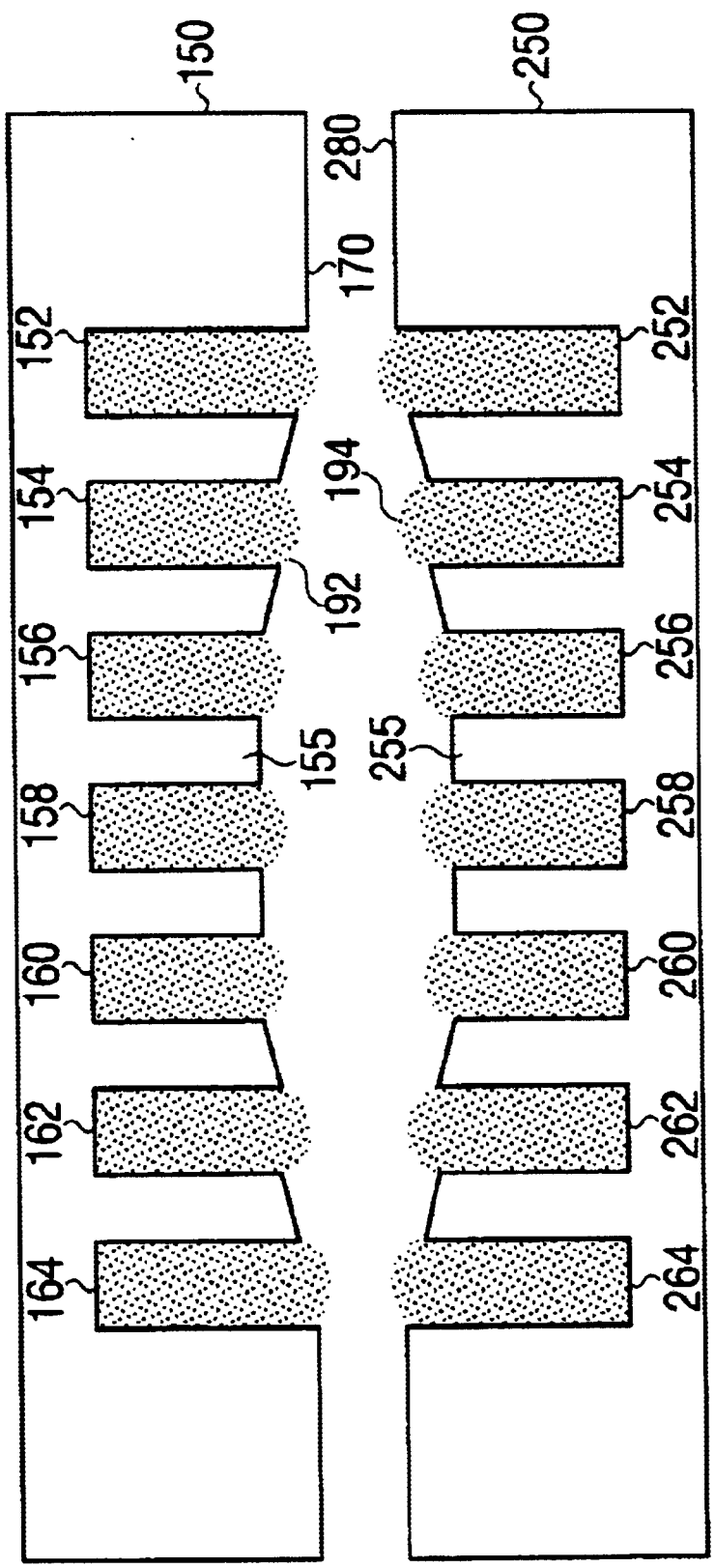
FIG. 5 illustrates two separated wafers having metalized trenches.

As one solution to the problem shown in FIGS. 3 and 4, the dielectric material of the wafer may be over polished such that the metal in each of the respective trenches protrudes (or extends) beyond the surface of the wafer. More particularly, FIG. 5 illustrates an arrangement in which dielectric material 155 forming the wafer 150 may be etched back (or over polished) such that portions of the metal within the trenches 152–164 protrude beyond the surface 170. As one example, the dielectric material 155 of the wafer 150 may be polished such that metal 192 may protrude beyond the bottom surface 170 of the wafer 150. Similarly, dielectric material 255 of the wafer 250 may be polished such that metal 194 may protrude beyond the top surface 280 of the wafer 250. That is, a CMP process may eliminate the metal recess and dishing. However, it may be difficult to eliminate the other negative topographical features such as the curvature and local thickness variations. Unfortunately, the metal filling the trenches may not be soft enough to allow the protruding metal to deform significantly so as to facilitate reliable electrical connection in the locally recessed areas.

Figure 6:
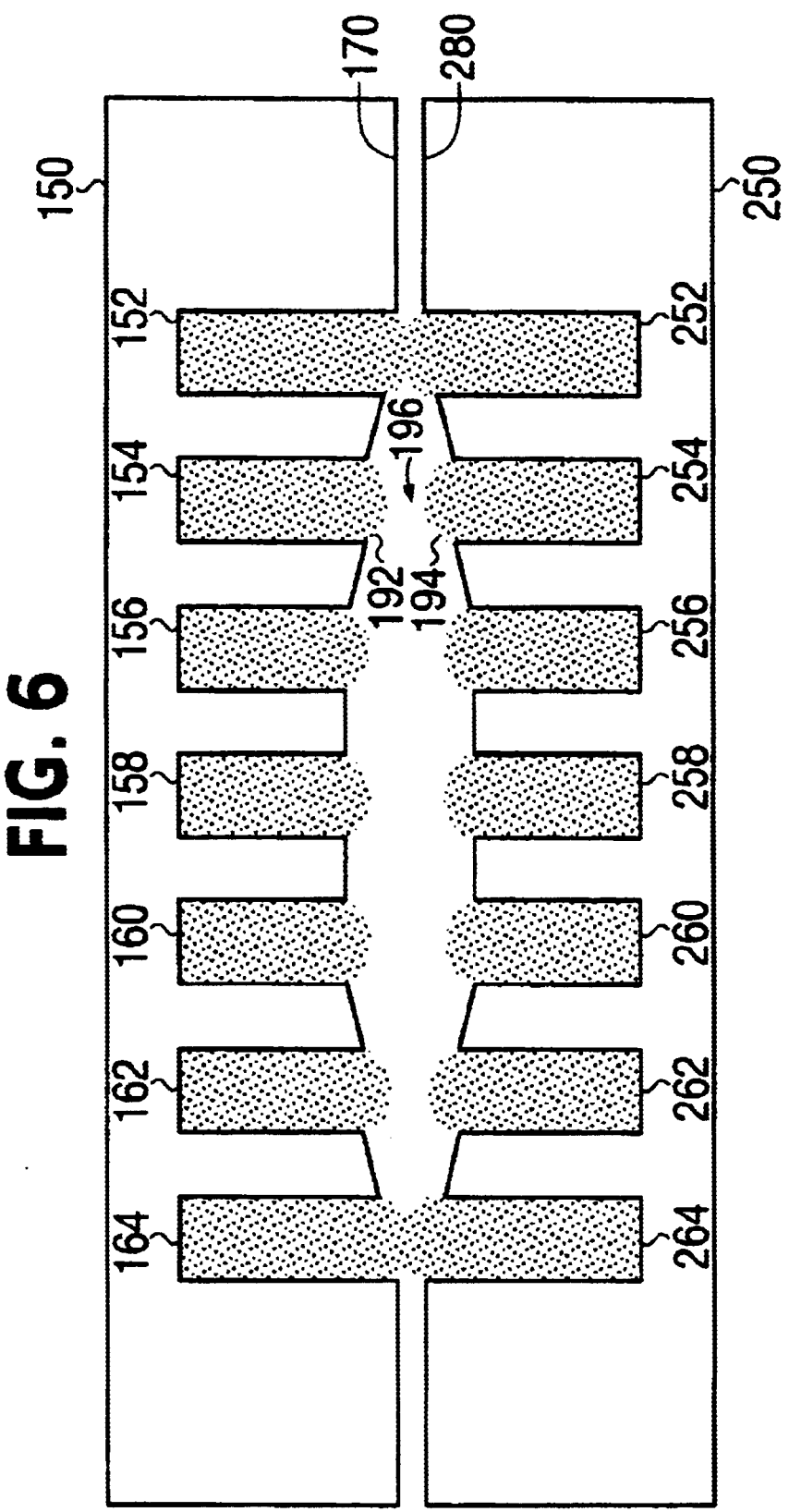
FIG. 6 illustrates the wafers of FIG. 5 joined together.

FIG. 6 illustrates the wafers 150 and 250 after they have been pressure bonded together. As may be seen, even though the metal 192 protrudes beyond the bottom surface 170 of the wafer 150, the metal 192 does not electrically contact the metal 194 protruding beyond the top surface 280 of the wafer 250. In this example, the metal within the trench 152 is shown as being electrically coupled to the metal within the trench 252 and the metal within the trench 164 is shown as being electrically coupled to the metal within the trench 264. Accordingly, the arrangement shown in FIG. 6 includes an electrical gap 196 (or electric open) between the metal 192 and the metal 194 as well as electrical gaps between each of the metals within the trenches 156, 158, 160 and 162 and the corresponding metals within the trenches 256, 258, 260 and 262.

That is, the metal may extend above the wafer surface and the wafers may be pressed together under high pressure and at elevated temperature. Despite these efforts, obtaining electrical contact reliably all over the wafer-to-wafer interface may pose a technological challenge, questioning applicability of this technique in high-volume manufacturing. In addition, even if electrical contact is achieved, interconnects in places where the wafer is thinner are under tension and are a reliability concern due to stress and electromigration voiding.

Embodiments of the present invention may facilitate the bonding of wafers with reliable electrical connections consistently all over the wafer. With this technique, the corrosion risk of the copper (or copper alloy) forming the metalized trenches may be reduced because the copper may be encapsulated by a barrier (or barrier layer) and solder. If a low-temperature solder is used, then the thermal budget may be lower than in previously used processes. Since there may be an air gap between the wafer surfaces, defects such as small particles may be less of a concern.

Embodiments of the present invention may fill the top of the trenches with a material that deforms easily during the bonding process such as a low temperature solder. Upon bonding, the solder may melt or reflow and get compressed into thicker areas of the wafers thereby facilitating electrical connection in thinner parts of the wafer. This process is less defect sensitive than conventional bonding because the wafer surfaces are not in immediate contact upon bonding. In addition, if a low-temperature solder is used, this process may utilize a lower temperature than the temperature typically needed for metal-to-metal bonding. That is, for copper metal a temperature of at least 400° C. may be used. A diffusion barrier (or barrier layer) may also be provided between the metal and solder to prevent interdiffusion.

Figure 7:
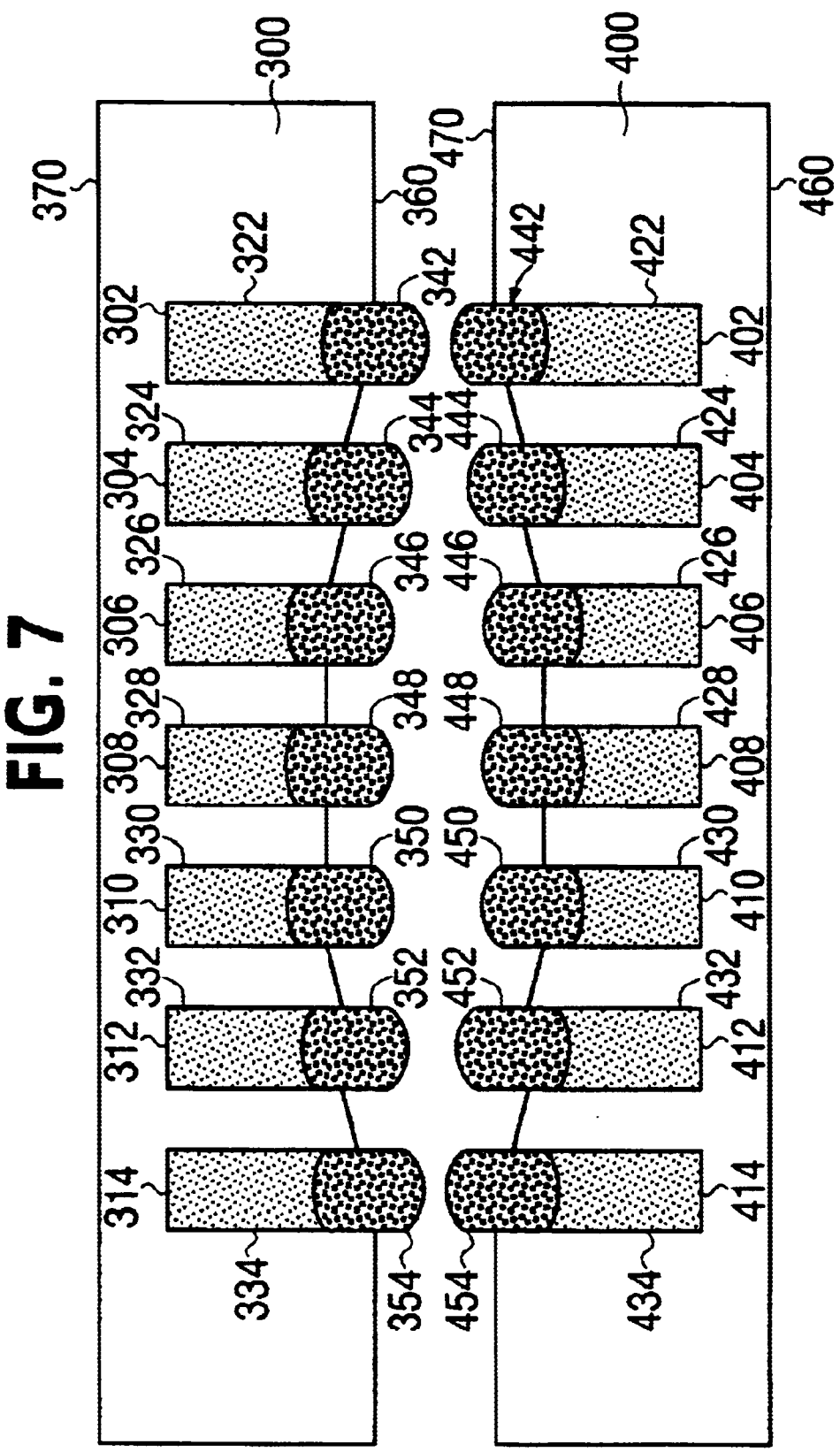
FIG. 7 illustrates two separated wafers having metalized trenches with solder formed thereon according to an example embodiment of the present invention.

FIG. 7 illustrates two wafers according to an example embodiment of the present invention. Other embodiments and configurations are also within the scope of the present invention. More particularly, FIG. 7 illustrates a first wafer 300 having a bottom surface 360 and a top surface 370. The wafer 300 also includes a plurality of trenches 302, 304, 306, 308, 310, 312 and 314 formed along the bottom surface 360 of the wafer 300. While FIG. 7 illustrates a curved bottom surface 360, embodiments of the present invention are also applicable to the bottom surface 360 being planar. Each of the trenches 302–314 may be filled with a corresponding metal 322, 324, 326, 328, 330, 332 and 334 to form metalized trenches. Similar to that described above, the metal may be copper, a copper alloy or any other well-known type of metal. FIG. 7 also shows solder formed on the metal within each of the trenches 302–314 in accordance with an example embodiment of the present invention. That is, FIG. 7 shows solder 342 formed on the metal 322, solder 344 formed on the metal 324, solder 346 formed on the metal 326, solder 348 formed on the metal 328, solder 350 formed on the metal 330, solder 352 formed on the metal 332, and solder 354 formed on the metal 334.

FIG. 7 also illustrates a second wafer 400 having a bottom surface 460 and a top surface 470. The wafer 400 also includes a plurality of trenches 402, 404, 406, 408, 410, 412 and 414 formed along the bottom surface 460 of the wafer 400. While FIG. 7 illustrates a curved top surface 470, embodiments of the present invention are also applicable to the top surface 470 being planar. Each of the trenches 402–414 may be filled with a corresponding metal 422, 424, 426, 428, 430, 432 and 434 to form metalized trenches. Similar to that described above, the metal may be copper, a copper alloy or any other well-known type of metal. FIG. 7 also shows solder formed on the metal within each of the trenches 402–414 in accordance with an example embodiment of the present invention. That is, FIG. 7 shows solder 442 formed on the metal 422, solder 444 formed on the metal 424, solder 446 formed on the metal 426, solder 448 formed on the metal 428, solder 450 formed on the metal 430, solder 452 formed on the metal 432, and solder 454 formed on the metal 434.

Accordingly, solder bonds or lines may melt (or reflow) during the bonding process and may undergo extensive deformation. Extruding, molten solder balls may easily be compressed, and recessed solder balls may be electrically connected given that the solder thickness is comparable to the thickness variation over the wafer.

Figure 8:
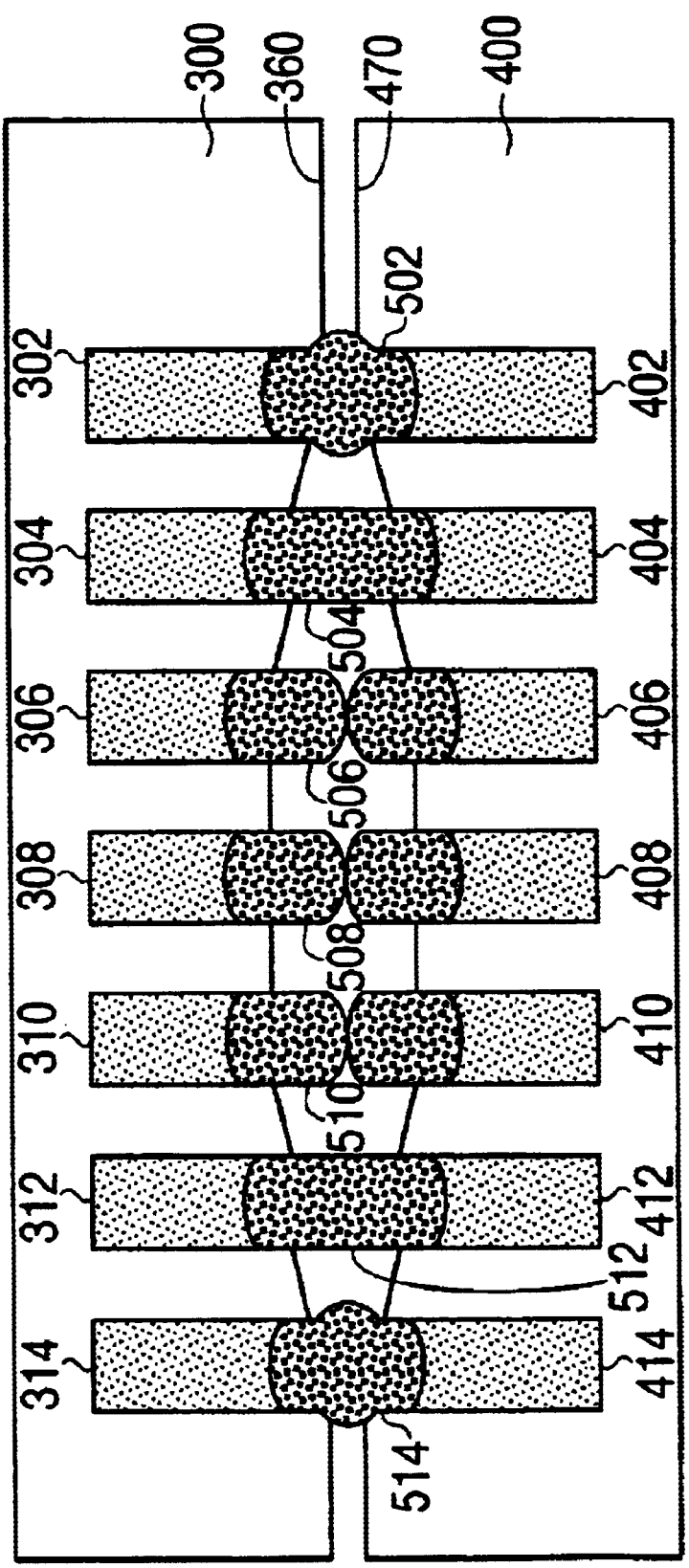
FIG. 8 illustrates the wafers of FIG. 7 joined together.

More particularly, FIG. 8 illustrates the wafers 300, 400 after they have been solder bonded in accordance with an example embodiment of the present invention. Other embodiments and configurations are also within the scope of the present invention. As shown in FIG. 8, a solder mass 502 may be formed by the solder 342 and the solder 444 (of FIG. 7). Similarly, a solder mass 504 may be formed by the solder mass 344 and the solder 444, a solder mass 506 may be formed by the solder 346 and the solder 446, a solder mass 508 may be formed by the solder 348 and the solder 448, a solder mass 510 may be formed by the solder 350 and the solder 450, a solder mass 512 may be formed by the solder 352 and the solder 452, and a solder mass 514 may be formed by the solder 354 and the solder 454. The solder masses 502–514 may electrically connect the metal within the trenches 302–314 to the metal within the trenches 402–414.

As indicated above, the solder may be placed on both wafers 300 and 400. The solder may be heated to a temperature above the melting point of the solder that causes the solder to melt or reflow during the bonding process to allow its deformation. The wafers 300 and 400 may be placed together (and possibly pressure bonded) while the solder is heated thereby causing the respective solder balls on each of the wafers to reflow together. This additionally provides a good bond between each of the wafers. The solder may be applied on to the respective metalized trenches in any of a number of well-known manners, including electroplating and electrolessplating. Due to the size of the solder mass between the wafers, an air gap may be provided between the wafers.

In at least one embodiment, a barrier (or barrier layer) may be formed over the metal within the metal trenches prior to applying the solder over the trenches.

Figure 9:
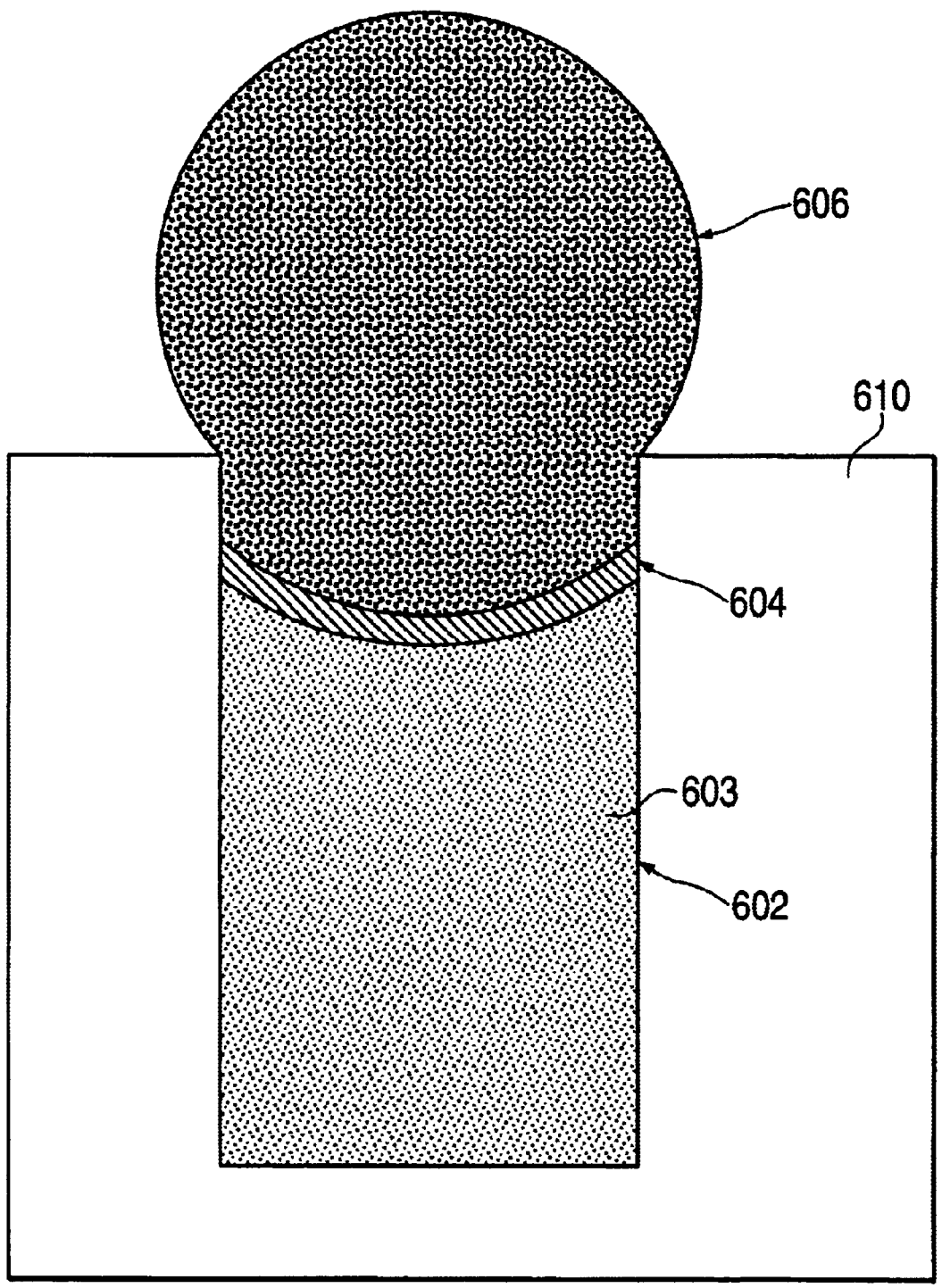
FIG. 9 illustrates a metalized trench having solder formed thereon according to an example embodiment of the present invention.

FIG. 9 illustrates a metalized trench having a barrier layer and solder according to an example embodiment of the present invention. Other embodiments and configurations are also within the scope of the present invention. More particularly, FIG. 9 illustrates a small portion of a wafer in which a trench 602 is formed within dielectric material 610. The trench 602 may have metal 603 deposited therein. This may be accomplished by lining the trench with a refractory metal and providing a copper seed within the trench. A barrier layer 604 may be formed over the metal 603 in the trench 602. Solder 606 may be provided over the barrier layer 604 in the trench 602.

In order to form such a structure, the barrier layer 604 may be deposited over the metal 603 and a seed layer may be provided on each wafer by selective plating or CVD (in which case lithography may not be needed), or by continuous-film deposition method followed by lithography using the existing top-metal mask and an etch step. The solder 606 may be deposited over the barrier layer 604 by selective plating on each wafer, for example. Then the wafers may be bonded at the solder's melting temperature, which is lower than the melting temperature of the metal 602. The barrier layer may prevent the interdefusion of the metal and the solder. The barrier layer may include, but is not limited to cobalt, nickel, tantalum, and titanium. Additionally, the seed layer materials may include, but are not limited to, NiV and copper. The solder may be any of a number of types of solder including lead-free solder and lead/tin solder.

Figure 10:
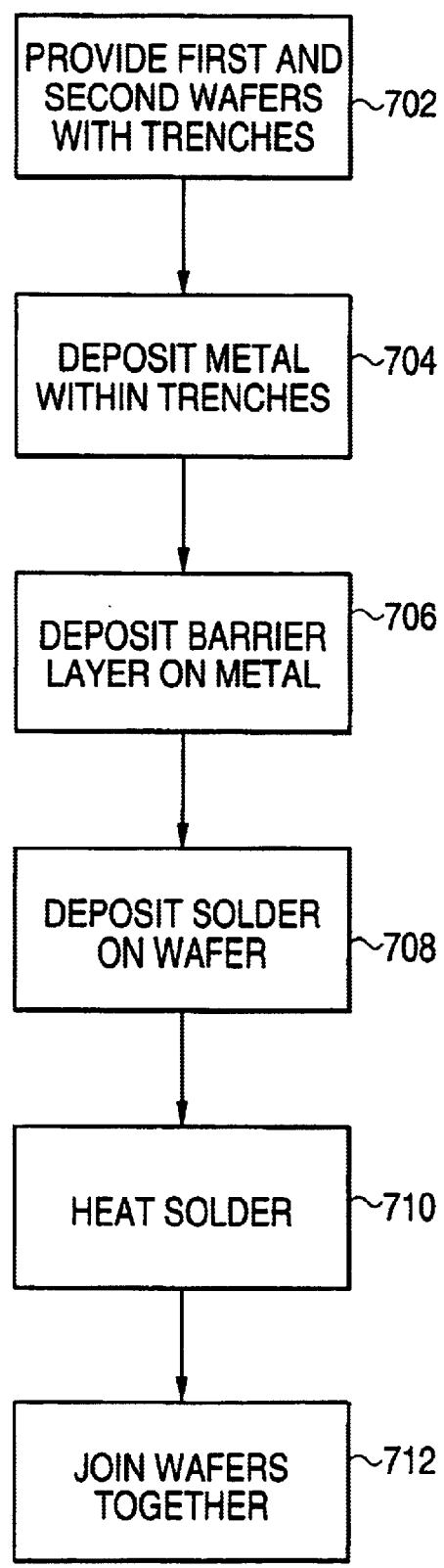
FIG. 10 is a flow chart showing operations for one example embodiment of the present invention.

FIG. 10 is a flowchart showing an example embodiment of the present invention. Other operations, orders of operations and embodiments are also within the scope of the present invention. More specifically, in block 702, the first and second wafer may be provided having trenches. In block 704, metal may be deposited within the trenches. A barrier material may be deposited onto the metal in block 706. In block 708, solder may be deposited on the wafer. The solder may be heated in bock 710. In block 712, the wafers may be joined together. Block 712 may also be performed at the same time that the solder is heated (block 710).

Accordingly, embodiments of the present invention may provide a method of forming a wafer stack. This may include providing a first wafer having a first plurality of metalized trenches on a surface of the first wafer and providing a second wafer having a second plurality of metalized trenches on a surface of the second wafer facing the first wafer. The first plurality of metalized trenches may be solder bonded to the second plurality of metalized trenches by a heating process.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method of forming a wafer stack comprising:
   providing a first wafer having a first plurality of metalized trenches on a surface;
   providing a second wafer having a second plurality of metalized trenches on a surface facing said first wafer; and
   solder bonding said first plurality of metalized trenches to said second plurality of metalized trenches.

2. The method of claim 1, wherein solder bonding comprises providing solder on at least each of said first plurality of metalized trenches.

3. The method of claim 2, wherein solder bonding further comprises providing solder on at least each of said second plurality of metalized trenches.

4. The method of claim 2, wherein said solder is provided by electroplating.

5. The method of claim 2, wherein said solder is provided by electroless plating.

6. The method of claim 2, wherein solder bonding further comprises providing a barrier layer on said first plurality of metalized trenches prior to providing said solder.

7. The method of claim 6, wherein said barrier layer comprises one of cobalt, nickel, tantalum and titanium.

8. The method of claim 1, wherein solder bonding comprises heating at least said solder to cause reflow.

9. The method of claim 1, wherein said solder comprises lead-free solder.

10. The method of claim 1, wherein said solder comprises lead based solder.

11. A method of forming a wafer stack comprising:
    applying solder to metalized areas on a first wafer;
    applying solder to metalized areas on a second wafer; and
    bonding said metalized areas on said first wafer to metalized areas on said second wafer by heating said solder.

12. The method of claim 11, wherein said bonding comprises pressure bonding said first wafer to said second wafer.

13. The method of claim 11, wherein bonding comprises heating said solder such that said solder on said first wafer electrically contacts said solder on said second wafer.

14. The method of claim 11, wherein said solder is heated to a temperature greater than a melting temperature of said solder.

15. The method of claim 11, further comprising providing a barrier layer on said metalized areas prior to applying solder to said metalized areas of said first wafer.

16. The method of claim 15, wherein said barrier layer comprises one of cobalt, nickel, tantalum and titanium.

17. The method of claim 11, wherein said solder comprises lead-free solder.

18. The method of claim 11, wherein said solder comprises lead based solder.

* * * * *